United States Patent
Costa et al.

(10) Patent No.: US 9,552,804 B2
(45) Date of Patent: *Jan. 24, 2017

(54) MANAGING ACOUSTIC NOISE PRODUCED BY A DEVICE

(71) Applicant: Apple Inc., Cupertino, CA (US)

(72) Inventors: Paul J. Costa, Sunnyvale, CA (US); David R. Cox, Los Gatos, CA (US); Benjamin A. Bard, San Jose, CA (US)

(73) Assignee: Apple Inc., Cupertino, CA (US)

( * ) Notice: Subject to any disclaimer, the term of this patent is extended or adjusted under 35 U.S.C. 154(b) by 522 days.

This patent is subject to a terminal disclaimer.

(21) Appl. No.: 13/913,472

(22) Filed: Jun. 9, 2013

(65) Prior Publication Data

US 2013/0272534 A1 Oct. 17, 2013

Related U.S. Application Data

(63) Continuation of application No. 11/867,622, filed on Oct. 4, 2007, now Pat. No. 8,462,959.

(51) Int. Cl.
| | |
|---|---|
| *G10K 11/16* | (2006.01) |
| *G06F 1/20* | (2006.01) |
| *H05K 7/20* | (2006.01) |

(52) U.S. Cl.
CPC ............... *G10K 11/16* (2013.01); *G06F 1/20* (2013.01); *H05K 7/20209* (2013.01)

(58) Field of Classification Search
CPC .......... G06F 1/206; G06F 1/3203; G06F 3/16; G06F 1/20; G10K 15/04; G10K 11/16; H05K 7/20209

USPC .. 381/71.1–71.9, 71.11–71.14, 94.1; 700/94; 702/35, 39, 56, 141

See application file for complete search history.

(56) References Cited

U.S. PATENT DOCUMENTS

| | | | | |
|---|---|---|---|---|
| 4,715,559 | A | * 12/1987 | Fuller | ............... G10K 11/1786 181/206 |
| 6,591,198 | B1 | 7/2003 | Pratt | |
| 6,824,362 | B2 | 11/2004 | Dodson | |
| 7,139,401 | B2 | 11/2006 | Culman et al. | |
| 7,224,810 | B2 | 5/2007 | Brown | |
| 7,693,292 | B1 | 4/2010 | Gross et al. | |
| 2004/0120113 | A1 | 6/2004 | Rapaich | |
| 2005/0094823 | A1 | 5/2005 | Kobori et al. | |
| 2005/0168180 | A1 | * 8/2005 | Minekawa | .......... H01M 10/613 318/268 |
| 2009/0092261 | A1 | 4/2009 | Bard | |
| 2010/0028134 | A1 | * 2/2010 | Slapak | ................... F24F 13/24 415/119 |

* cited by examiner

*Primary Examiner* — David Ton
(74) *Attorney, Agent, or Firm* — Kilpatrick Townsend & Stockton LLP

(57) ABSTRACT

One embodiment of the present invention provides a system that manages the acoustic noise produced by a device. During operation, the system receives a set of acoustic characteristics for the device. The system then uses these acoustic characteristics to estimate the acoustic noise being generated by the device. Next, the system uses the estimated acoustic noise to adjust a setting in the device to manage the acoustic noise produced by the device.

23 Claims, 6 Drawing Sheets

MANAGING ACOUSTIC NOISE PRODUCED BY A DEVICE

CROSS-REFERENCE TO RELATED APPLICATION

This application is a continuation patent application of U.S. patent application Ser. No. 11/867,622, filed Oct. 4, 2007 and titled "Managing Acoustic Noise Produced by a Device," now U.S. Pat. No. 8,462,959, the disclosure of which is hereby incorporated herein in its entirety.

BACKGROUND

Field of the Invention

The present invention relates to techniques for adjusting the acoustic noise produced by an electronic device, such as a computer system.

Related Art

Electronic devices, such as computers and mobile telephones, are increasingly being used for both business and entertainment purposes. However, as these devices are used in a wider range of environments, acoustic noise produced by these devices becomes more likely to disturb both device users as well as nearby people. For instance, acoustic noise produced by storage devices, power supplies, and/or thermal-cooling components within these electronic devices may collectively produce undesirable acoustic noise. Unfortunately, reducing such unwanted acoustic noise can be difficult and expensive, because such noise-producing components are typically essential components in such devices.

Hence, what is needed is a method and an apparatus that facilitates using electronic devices without the above-described problems.

SUMMARY

One embodiment of the present invention provides a system that manages the acoustic noise produced by a device. During operation, the system receives a set of acoustic characteristics for the device. The system then uses these acoustic characteristics to estimate the acoustic noise being generated by the device. Next, the system uses the estimated acoustic noise to adjust a setting in the device to manage the acoustic noise produced by the device.

In some embodiments, the system identifies and characterizes the set of noise-producing components in the device. For instance, the system can calculate an individual estimated acoustic noise profile for each noise-producing component in the device.

In some embodiments, the set of acoustic characteristics includes an acoustic transfer function that describes noise characteristics for one or more noise-producing components in the device.

In some embodiments, the system determines the estimated acoustic noise produced by the device by combining the individual estimated acoustic noises for two or more noise-producing components.

In some embodiments, the system uses a microphone to determine an ambient noise level for an environment surrounding the device. The system uses this measured ambient noise data to adapt to ambient conditions in the environment when adjusting settings for one or more device components.

In some embodiments, the system receives a specified maximum acoustic noise level for the device. During operation, the system dynamically monitors the estimated acoustic noise produced by the device to track an acoustic noise margin between the estimated acoustic noise and the specified maximum acoustic noise level.

In some embodiments, the system adjusts the power usage and/or the performance of one or more device components to ensure that the acoustic noise that is produced by the device remains below the specified maximum acoustic noise level.

In some embodiments, the system determines a level of system activity for the device. For instance, the system can request the level of system activity from an operating system for the device and/or monitor power usage data for the device to infer system activity and user state. During operation, the system can use this determined level of system activity to adjust the power usage and/or performance of one or more device components.

In some embodiments, the system receives an acoustic preference from a user. The system can adjust settings for one or more device components during operation based on this user acoustic preference.

In some embodiments, the system is used during device testing and/or product development to gather diagnostic data and to ensure that the device operates within a set of specified acoustic bounds.

Table 1 illustrates exemplary acoustic transfer functions for a set of noise-producing components in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, nonvolatile memory, magnetic and optical storage devices such as disk drives, magnetic tape, CDs (compact discs), DVDs (digital versatile discs or digital video discs), or other media capable of storing computer-readable media now known or later developed.

Existing Thermal and Acoustic Design Techniques

Many electronic devices include active cooling elements that dissipate heat generated during operation to avoid component damage. For instance, electronic devices are often equipped with cooling fans or pumps that remove heat from hot components. The set of cooling components included in a device is sometimes determined based on the amount of power expected to be consumed and/or dissipated by the device. During device operation, the difference between the maximum cooling capacity and the present heat level is called the "thermal margin" for the device. A thermal control system is typically included in devices to monitor such thermal data and to actively maintain a thermal margin for device components.

Figure 1:
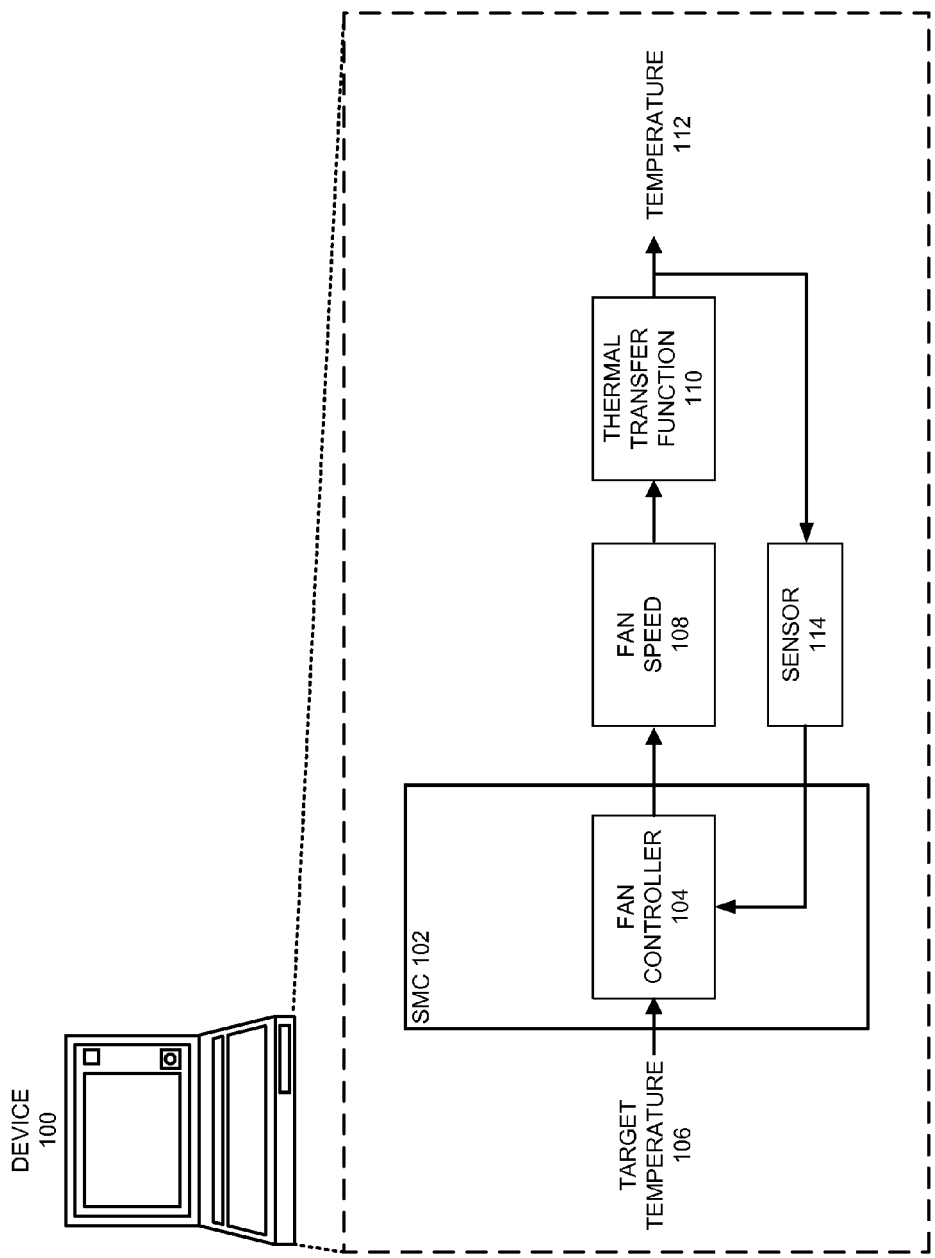
FIG. 1 illustrates the high-level operation of a thermal controller in a device in accordance with an embodiment of the present invention.

FIG. 1 illustrates the high-level operation of a thermal controller included as part of a system management controller (SMC) 102 for device 100. Fan controller 104 in SMC 102 receives a target temperature 106, along with a reading of the current temperature 112 from sensor 114. Based on the received values, fan controller 104 adjusts a device fan speed 108 to create airflow through a device enclosure (not shown). Thermal transfer function 110 is a representation of how the enclosure converts airflow and power usage into component temperatures. The present measured temperature 112 is monitored by sensor 114 and fed back to the fan controller 104.

Thermal control and acoustic performance related to thermal-related noise sources are often pursued as two separate but overlapping efforts during the process of designing a device. From a thermal-centric viewpoint, designers often specify that a control system primarily ensures that all components are sufficiently cooled, and then, if no additional cooling is needed, fans and/or cooling devices can be slowed down to reduce associated noise. This design process follows the logic that exceeding thermal limits can be detrimental to continued device operation, while acoustic noise may be annoying but is typically non-destructive. Hence, thermal control systems are typically designed to guarantee thermal regulation across various performance states while minimizing fan speed as a secondary goal.

In parallel to thermal design, acoustical engineers separately measure sound level over various performance and ambient temperature states to compare the acoustic noise output against an acoustic specification. As with the thermal margin, the difference between the actual noise level and a specified maximum noise level is the acoustic margin. Acoustical engineers typically perform noise checks on a number of sample devices to determine if the sample devices meet the acoustic specification. For instance, fan speed information may be logged in various steady-state conditions to measure corresponding noise levels. Note that this sampling approach has a number of disadvantages. Disadvantages include:

the sample size of the analyzed units is small and sometimes does not match the full range of potential system configurations;

the analysis only monitors the steady-state performance of the acoustics, thereby missing transient effects; and the described thermal control system (shown in FIG. 1) includes sufficient infrastructure to allow thermal outliers to be identified for further analysis during testing, but does not include any way to automate monitoring acoustic performance during production and build testing.

Because some of the acoustic noise produced by a device may be directly related to a device's power usage, and hence performance, guaranteeing both thermal and acoustic performance for a design can be challenging. Indirectly controlling such acoustic noise via the thermal control system is often difficult and inefficient. System designers may be able to reduce acoustic noise as a byproduct of optimizing a device's thermal control system and via careful component selection, but this task is complicated by the frequent need to select device components early in the design process, before a highly accurate acoustic test bed is available. Hence, the need to ensure that the device will comply with the thermal and acoustic specifications can lead to selecting components with low power demands that ensure large thermal and acoustic margins, but at the price of performance sacrifices. Such issues have become increasingly difficult due to ongoing demand for increased device performance and a corresponding decrease in thermal and acoustic margins.

In the above-described thermal-centric development model, the thermal control system does not have sufficient data to determine real-time acoustic performance to ensure compliance with acoustic specifications. In one embodiment of the present invention, a system calculates the sound levels of the noise-producing components in a device to provide real-time verification of an acoustic specification. The ability to estimate the acoustic noise produced by a device in real time facilitates dynamic acoustic control, thereby allowing designers to include higher-power (and hence higher-performance) components without degrading the user's acoustical experience.

Real-Time Acoustic Monitoring

"Noise" is often defined as unwanted sound generated by system components, in contrast to intentional audio output produced by a sound-producing audio component (such as a speaker). More specifically, "acoustic noise" is typically defined as unwanted sound radiated from components as a byproduct of system operation. Another form of noise, "audio noise," is generally defined to be unwanted sound generated from audio components (e.g., static noise or interference-based noises produced by a speaker).

In one embodiment of the present invention, a system monitors the acoustic noise produced by a device during operation. For instance, the system may identify a set of acoustic noise sources in the device that have a significant effect on the total acoustic noise produced by the device. The system can use characterization data for each noise source to calculate and combine the acoustic noise produced by the individual noise sources, and can thereby produce a set of real-time estimates of the device's total acoustic noise output. Such noise sources often include motor-driven moving parts, such as fans and disk drives, as well as a range of other sound-producing components. For instance, noise-producing components can include: a hard drive; an optical drive; a fan or other cooling device; a capacitor; a power and/or video inverter; or a power adapter. Note that characterizations of such components may incorporate both constant as well as variable values that depend on different modes of device operation.

In one embodiment of the present invention, the system receives a set of characterization data for the noise-producing components in the device. For instance, acoustical engineers may determine an acoustic transfer function for each noise source that captures how the sound level produced by the noise source changes over various operating modes. For example, for a fan, the acoustic transfer function may determine the acoustic noise produced based on the revolutions per minute (rpm) of the fan. Such characterization data may be formulated by measuring a representative set of components in an environment that is operationally similar to the environment expected in the device, thereby generating an accurate acoustic noise model that also accounts for component variation.

Table 1 illustrates exemplary acoustic transfer functions for a set of noise-producing components. The characterization functions shown in Table 1 use system control parameters (such as fan rpm x) to determine sound pressure level estimates. In this example, these acoustic transfer functions provide a sound-pressure level (measured in decibels (dB)) for each individual noise-producing component in the device. These individual dB values can be combined to determine a combined total sound-pressure level for all of the noise-producing components of the device, dBATotal, for instance by using a logarithmic sum of the individual sound-pressure values.

Acoustic transfer function equations may be derived in a number of ways. For instance, one technique for determining an acoustic transfer function is to fit a set of data points that describe a number of different component states to a curve. In another example, the hard drive motor illustrated in Table 1 is considered to be constant, because a hard drive typically spins its platters at a fixed speed when active. However, note that a more-detailed acoustic transfer function for the hard drive may take into account whether the drive platters are currently spinning or temporarily at rest, or can include the acoustic noise produced by movement of the disk arm during disk activity.

TABLE 1

| Component | Acoustic Transfer Function Equations | Output Key |
|---|---|---|
| Optical Drive Fan | $-1E - 06x^2 + 0.0152x - 0.588$ | dBA0 |
| Processor Fan | $+1E - 07x^2 + 0.0112x - 4.6852$ | dBA2 |
| Hard Drive Fan | $-8E - 07x^2 + 0.0129x - 1.0115$ | dBA1 |
| Hard Drive Motor | 17.5 | dBAH |
| System Total | dB sum(dBA0, dBA1, dBA2, dBAH) | dBATotal |

Note that the system control parameters in the acoustic transfer functions may often be readily available to the acoustic control system. For instance, specific fan speed information may already be monitored and/or controlled by a device's thermal control system. In this case, an acoustic control system might be tightly coupled to the thermal control system, to facilitate accessing such data and thereby avoiding additional sensing circuitry.

Figure 2:
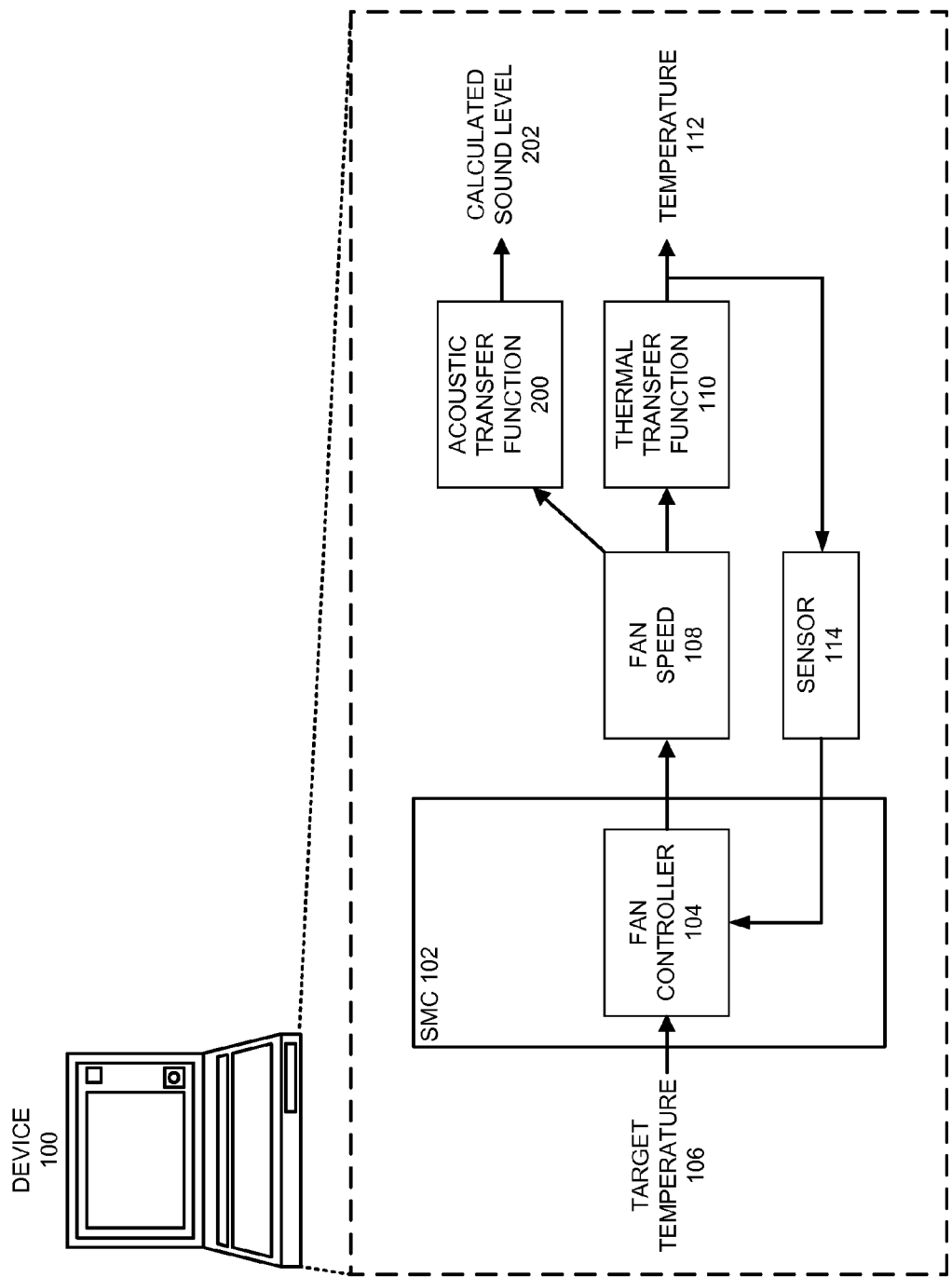
FIG. 2 illustrates the high-level operation of a device with a thermal controller and an added acoustic transfer function in accordance with an embodiment of the present invention.

FIG. 2 illustrates the high-level operation of a device with a thermal controller and added acoustic transfer function 200. During operation, the device's acoustic transfer function 200 uses fan speed 108 to estimate a calculated sound level 202 that is currently being produced by the device.

Note that characterizations derived from a representative component sample do not facilitate detecting acoustic anomalies in specific installed components, such as a fan failure or an acoustic noise generated by a broken fan blade rubbing against its plastic enclosure. Such specific component anomalies typically cannot be detected using general characterizations that describe a large set of components, but instead would need to be detected using direct feedback mechanisms in each individual device. However, the general characterizations can be used to generate an estimate of acoustic noise for components.

Real-Time Acoustic Control

In one embodiment of the present invention, the system strives to manage the acoustic noise produced by a device during operation. For instance, the system may track the acoustic noise level produced over time to ensure that this acoustic noise level stays below a specified threshold (or target) sound level defined for one or more different device states. Note that the specified sound level may be specified in a variety of ways, for example as a low target sound level that the system strives to achieve and/or maintain, or as a sound level limit that the system strives not to exceed. The target sound level and acoustic control system may also be associated with a non-linear function that increases the importance of reducing acoustic noise produced by the device as the difference between the acoustic noise produced and the specified target sound level increases.

Figure 3:
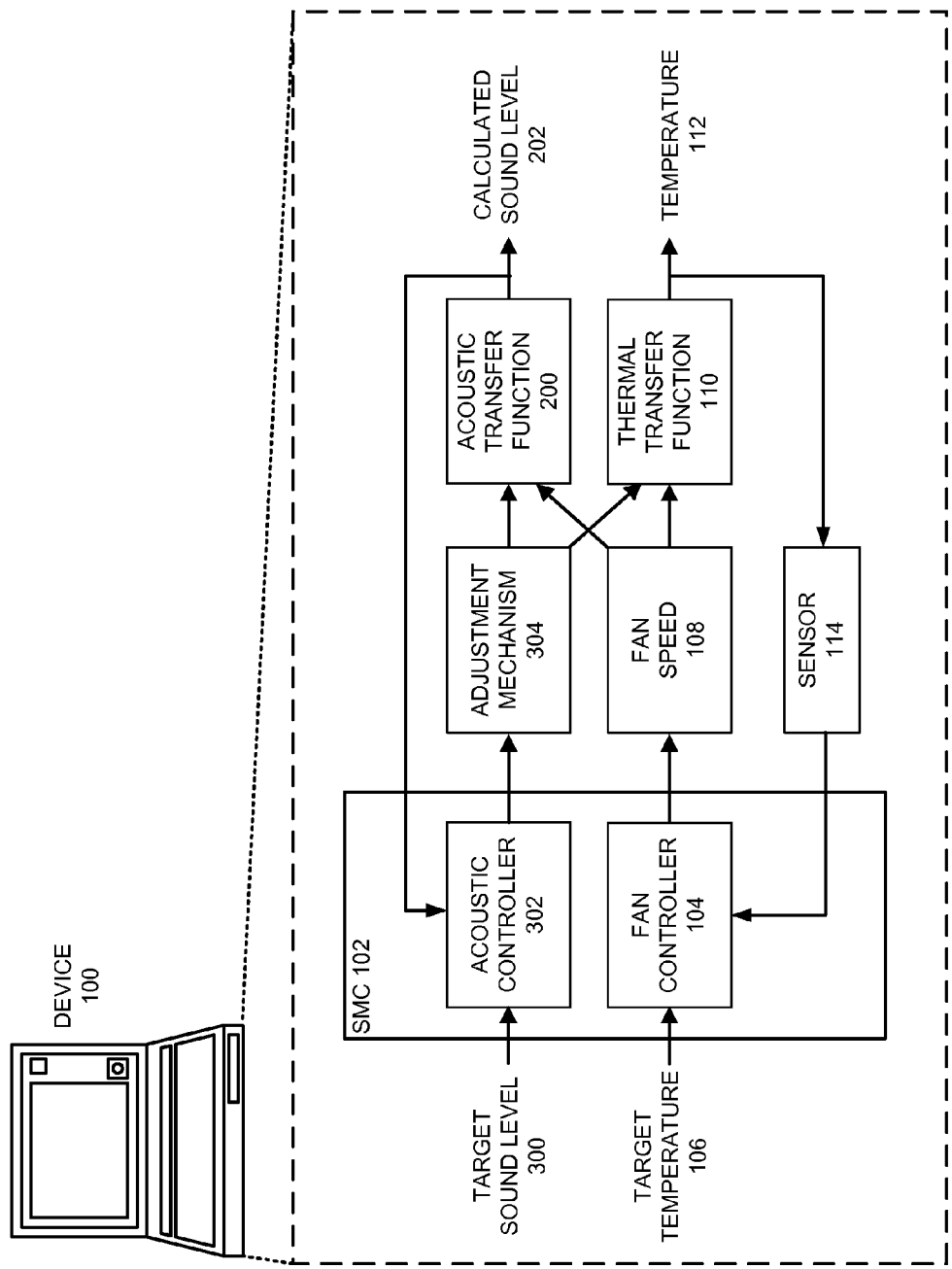
FIG. 3 illustrates the high-level operation of a device with an integrated thermal and an acoustic control system in accordance with an embodiment of the present invention.

FIG. 3 illustrates the high-level operation of a device with an integrated thermal and acoustic control system. In addition to target temperature 106, this system also receives a target sound level 300 as an input to acoustic controller 302. During operation, acoustic controller 302 manages the device sound level by: (1) monitoring the target sound level 300 and the present output of acoustic transfer function 200 (e.g., the calculated sound level 202); (2) calculating the difference between the calculated sound level 202 and the target sound level 300; and (3) if necessary, using adjustment mechanism 304 to adjust a component in the device to match the calculated sound level 202 to the target sound level 300. Note that if the acoustic noise produced by the device is already below the target sound level 300 during operation, the acoustic controller 302 may not need to trigger any changes, and the thermal system dictates normal operation (as in FIG. 1). However, if the calculated sound level 202 exceeds the target sound level 300, the acoustic controller 302 may prompt an adjustment to ensure that the calculated sound level 202 is reduced. The acoustic control system shown in FIG. 3 can be implemented using a number of control-loop feedback mechanisms, such as a proportional-integral-derivative (PID) control loop that attempts to keep the calculated sound level 202 below and/or close to the target sound level 300.

Figure 4:
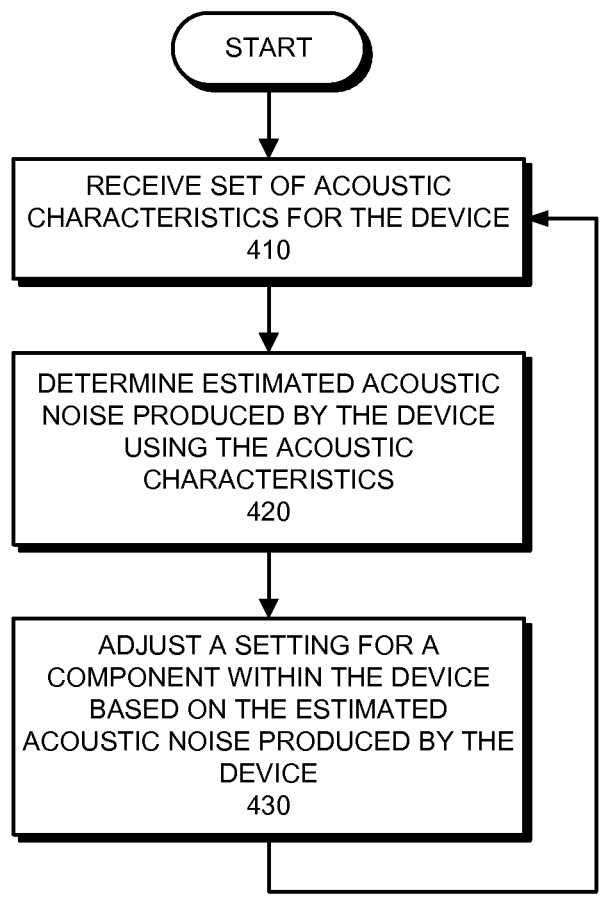
FIG. 4 presents a flow chart illustrating the process of managing the acoustic noise produced by a device in accordance with an embodiment of the present invention.

FIG. 4 presents a flow chart illustrating the process of managing the acoustic noise produced by a device. During operation, the system receives a set of acoustic characteristics for the device (operation 410). Next, the system determines an estimated acoustic noise produced by the device using these acoustic characteristics (operation 420). The system then adjusts a setting for a device component based on this estimated acoustic noise to manage the acoustic noise produced by the device (operation 430).

In one embodiment of the present invention, the adjustment mechanism 304 adjusts a power level for a device component to reduce the acoustic noise produced.

Including an acoustic control mechanism in the device allows direct feedback based on the calculated acoustic noise, but because the acoustic noise is often directly related to thermal cooling of components with specified heat tolerances, simply reducing cooling without addressing heat generation is not a long-term solution. The system may need to reduce the load on the thermal system (e.g., by reducing power consumption) to produce less acoustic noise and stay below a target sound level. The adjustment mechanism 304 in the feedback loop of FIG. 3 can adaptively throttle the power used by one or more device components to ensure that the device does not exceed the target sound level 300 and the target temperature 106. For instance, the system may adjust the power state of the component whose temperature is presently causing an increased fan speed for the loudest fan in the device.

Note that a target sound level for a device may change over time, and is likely to be dependent on user state and/or the environment the device is in. Because the primary goal of a given device is typically to perform some function (e.g., computation), and not only to minimize sound output, the acceptable target sound level may change over time, and hence power throttling may only be performed selectively. For instance, a user might expect a computer to be silent when off and nearly silent when idle, but might accept an increased sound output when the computer is operating under a high workload. Moreover, a user may prefer that a device located in a bedroom never produce any audible acoustic noise, but may accept increased acoustic noise from a device located in a very warm environment. Determining an acceptable target sound level for a device often involves inferring information about the device's function, one or more user states, and/or the environment the device is in.

In one embodiment of the present invention, the system detects and incorporates user and environmental state when determining a target sound level for the acoustic controller. The system can determine such state information in a number of ways. For instance, the system can request that an operating system (OS) for the device report an activity level for the system or for components of the system (e.g., for a central processing unit, graphics processing unit, or hard drive). While querying the operating system of a device is likely to provide very relevant state information, this technique assumes an interface and level of communication that may not be available. For instance, the acoustic controller may not have any way to communicate with the operating system, or there may not be any guarantee of which specific operating system is running on the device.

An alternative technique for determining state information is to directly monitor the power usage of the device. For instance, an SMC 102 may use power monitors built into the device hardware to determine user state based on the amount of power that the system or components are using. From such information, the system can determine whether the device is running, and can estimate the user load. In an acoustic controller that is closely integrated with a thermal controller, such power monitoring information may already be readily available to the acoustic controller. Integration with the thermal controller may also provide access to other useful inputs, such as an ambient temperature sensor for the device.

Figure 5:
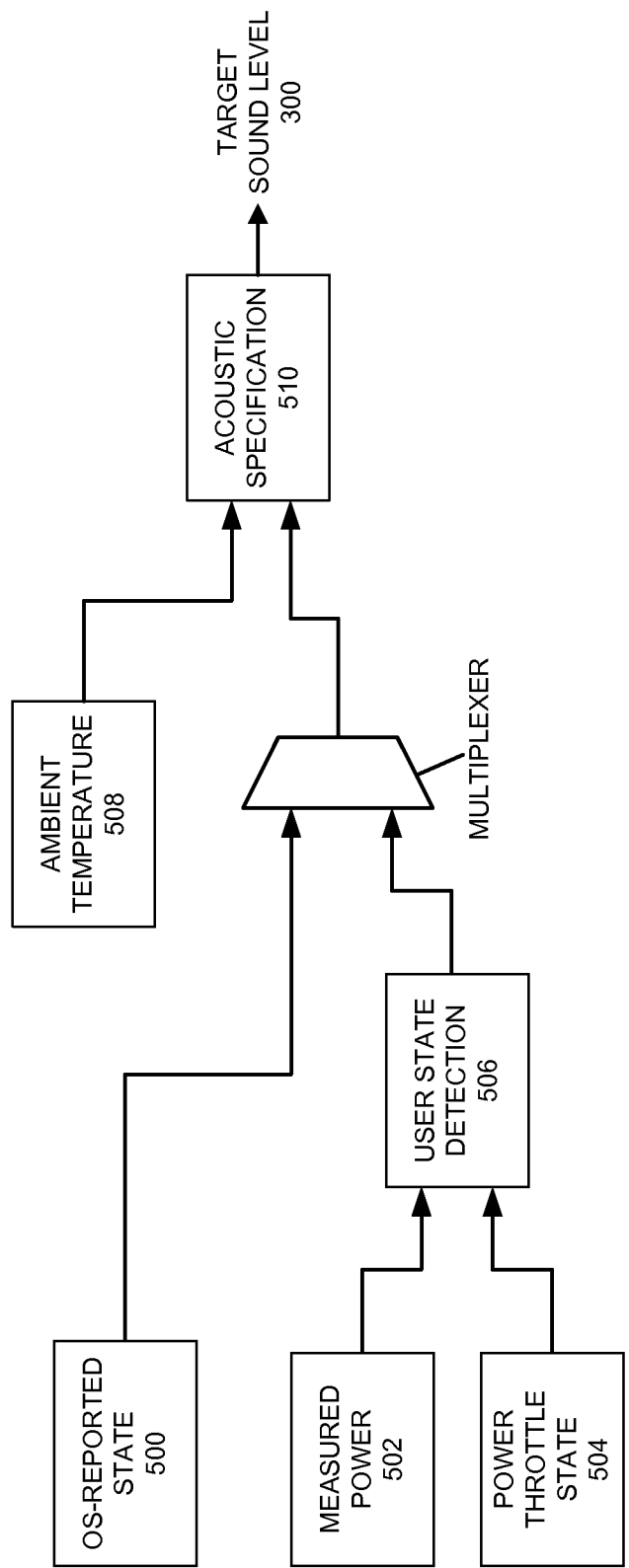
FIG. 5 illustrates several techniques for detecting user and environmental state from a device to determine a target sound level in accordance with an embodiment of the present invention.

FIG. 5 illustrates several techniques for detecting user and environmental state from a device to determine a target sound level 300. As described previously, the system can receive OS-reported state information 500, or can perform user state detection 506 by tracking the measured power 502 and the power throttle state 504. In the latter case, tracking the power throttle state 504 ensures that the user state is not misinterpreted when the acoustic system triggers a power adjustment, thereby avoiding erroneous feedback loops in the acoustic control system. For instance, a smaller amount of measured power may still indicate a heavy-use mode when in a power-throttled state. After gathering this data, along with any other available data (such as a measured ambient temperature 508), the system then determines a target sound level 300 using the acoustic specification 510. Note that some systems may gather and/or confirm such state data by using multiple techniques simultaneously, while others may only incorporate one such technique.

In one embodiment of the present invention, the system receives an acoustic preference from a user. For instance, the system can present to the user a range of acoustic and performance options for a device, and then allow the user to choose whether the system should be quieter, at the cost of slower performance, or high-performance, but with higher associated acoustic noise.

In one embodiment of the present invention, the acoustic control system is used during device testing to gather diagnostic data and to ensure that the device operates within a set of specified acoustic bounds. During testing, devices are often monitored to ensure that their cooling system is functioning properly and that their operating temperatures do not exceed a target temperature. However, in a device with a partially functioning cooling system (e.g., a poorly attached heat sink), the device may still successfully pass a diagnostic test but substantially increase the load on the cooling system and thereby produce an undesirable level of acoustic noise. Use of an acoustic control system during device testing allows such behavior to be detected and monitored, thereby assuring that only devices that adhere to the acoustic specification are released to customers.

Ambient Adaptation

In one embodiment of the present invention, the system includes a microphone that detects ambient noise. The system can use this microphone to determine the ambient sound level, which it then compares to the calculated sound level to determine how much the calculated system noise contributes to the sound level of the surrounding environment. In a room with a high ambient sound level, the acoustic controller may allow the system to exceed the acoustic specification and run at a higher power level. For example, a user who is playing loud music is not likely to notice the relatively small noise contribution of a computer cooling system. Hence, the system can use ambient noise measurements to adjust the target sound level.

Figure 6:
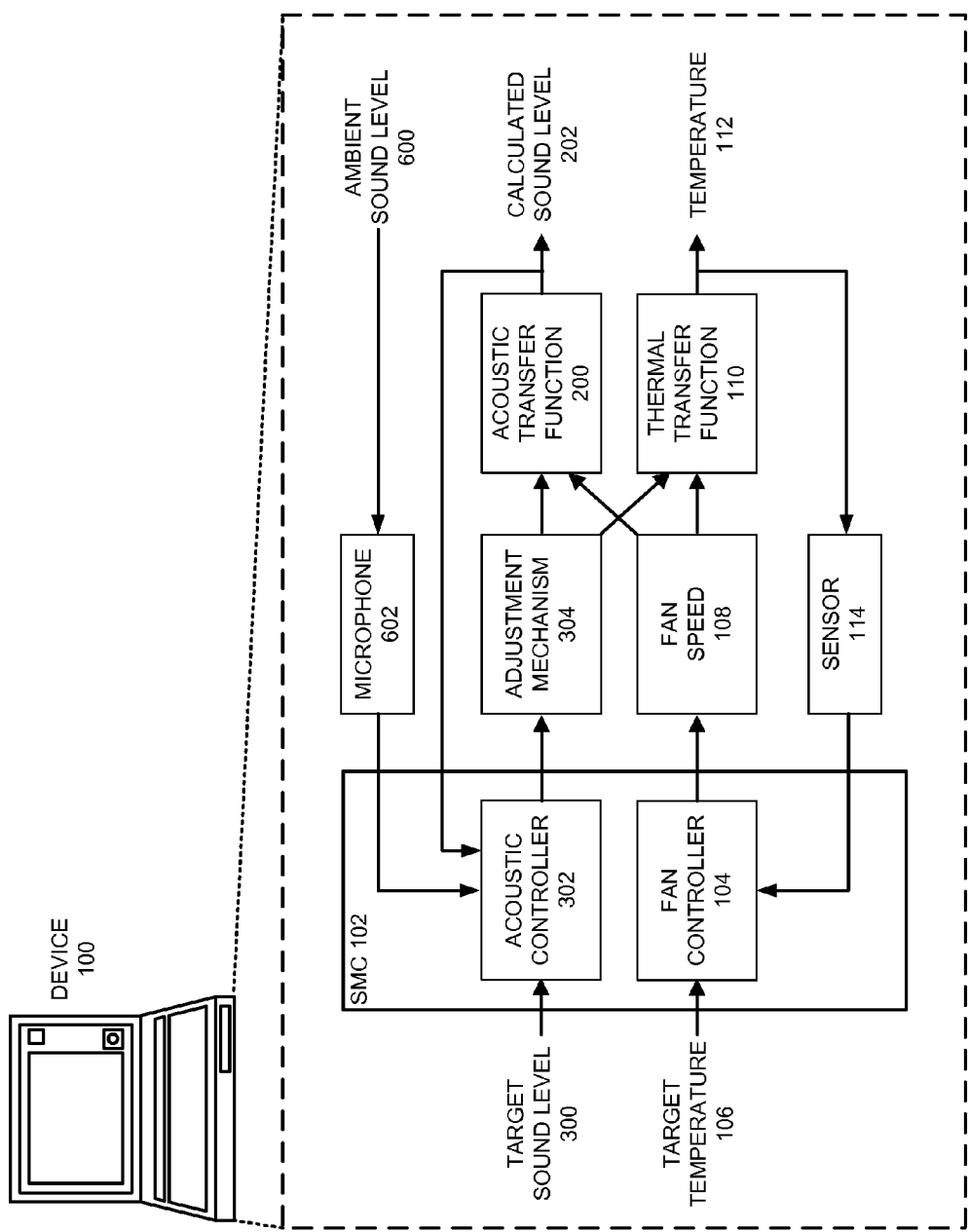
FIG. 6 illustrates the high-level operation of a device that incorporates a microphone for ambient adaptation in accordance with an embodiment of the present invention.

FIG. 6 illustrates the high-level operation of a device that incorporates a microphone 602 for ambient adaptation. During operation, microphone 602 measures the ambient sound level 600, and then presents ambient sound data to the acoustic controller 302, which considers this data in its decision-making process. The acoustic controller 302 may adjust, or choose to disregard, the target sound level 300 based on the input from the microphone 602.

In one embodiment of the present invention, the system uses the microphone to identify and characterize noise-producing components in the device. For instance, a device may selectively enable components during a boot process to measure their individual acoustic noise outputs, as well as to compare the actual acoustic noise produced by a specific given component with acoustic characterization data determined for a representative in an acoustic lab. Note that while the microphone included in the device may be of significantly lower fidelity than microphones used by acoustical engineers to characterize components, such input may still be useful. For instance, microphone input could serve as a useful reality check when performing a self-test to detect a failing component.

In summary, one embodiment of the present invention performs real-time acoustic monitoring to manage the acoustic noise produced by a device during operation. The described system:
  allows designers to incorporate higher power components without degrading the user's acoustical experience by allowing the system to directly respond based on measured acoustic state information;

enables system designers to more easily determine the acoustic impact of changes to the design, such as modifying the device enclosure, changing component and/or component power options, and changing the thermal control system;

facilitates identifying acoustic outliers among components and device states during device development;

facilitates monitoring the acoustic impact of the thermal control system's response to transient events; and allows the development of diagnostics that can verify that production units meet an acoustic specification.

Note that individual components of the described system can also be valuable in isolation. For instance, the acoustic transfer functions in isolation can be useful for data collection and real-time analysis, while power throttling may be useful in isolation to reduce sound levels when a device is idle.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer configured to manage acoustic noise, comprising:
   at least one component; and
   an acoustic controller operative to:
      identify an acoustic noise source in the computer;
      obtain acoustic characteristics for the acoustic noise source wherein the acoustic characteristics include characterization data that models acoustic noise produced by the acoustic noise source during operation;
      estimate an acoustic noise level for the computer using the acoustic characteristics; and
      adjust a setting of the at least one component of the computer based on the estimated acoustic noise level for the computer.

2. The computer of claim 1, wherein:
   the acoustic noise source comprises a set of acoustic noise sources; and
   the acoustic controller estimates the acoustic noise level by combining estimates for each of the noise sources.

3. The computer of claim 2, wherein the acoustic controller determines a target sound level and manages acoustic noise based at least on the target sound level.

4. The computer of claim 3, wherein the acoustic controller manages the acoustic noise to maintain produced acoustic noise at a level below the target sound level.

5. The computer of claim 3, wherein the acoustic controller manages the acoustic noise to reduce acoustic noise that is actually produced when the target sound level is exceeded.

6. The computer of claim 3, wherein the target sound level is determined based at least on user input.

7. The computer of claim 3, wherein the target sound level is determined based at least on at least one of ambient sound detected by a sound detection device or acoustic noise detected by the sound detection device.

8. The computer of claim 2, wherein the acoustic controller adjusts the setting of the at least one component of the computer by allowing a first acoustic noise source of the set of acoustic noise sources to produce a particular level of acoustic noise when the particular level of acoustic noise is exceeded by acoustic noise produced by a second acoustic noise source of the set of acoustic noise sources.

9. The computer of claim 2, wherein the acoustic controller revises the estimated acoustic noise level for the computer based at least on data from at least one sound detection device.

10. The computer of claim 2, wherein the acoustic controller adjusts the setting of the at least one component of the computer by adjusting a power level of the at least one component of the computer.

11. The computer of claim 10, wherein the acoustic controller adjusts the power level of the at least one component of the computer to reduce estimated acoustic noise level of at least one other component of the computer.

12. The computer of claim 11, wherein operation of the at least one component of the computer influences operation of the at least one other component of the computer.

13. The computer of claim 11, wherein the at least one other component of the computer comprises at least one cooling component.

14. The computer of claim 2, wherein the set of acoustic noise sources have a significant effect on produced acoustic noise by the computer.

15. The computer of claim 2, wherein the set of acoustic noise sources include at least one hard drive, optical drive, fan, cooling device, capacitor, power inverter, video inverter, or power adapter.

16. The computer of claim 2, wherein the characterization data that models acoustic noise produced by the noise source during operation includes an acoustic transfer function that models how a sound level produced by the noise source changes over various operating modes.

17. The computer of claim 2, wherein the characterization data that models acoustic noise produced by the noise source during operation is at least partially dependent on an operating state of the noise source.

18. The computer of claim 2, wherein the characterization data that models acoustic noise produced by the noise source during operation is at least partially independent of an operating state of the noise source.

19. The computer of claim 2, wherein the at least one component is one of the noise sources.

20. A method for managing acoustic noise produced by a computer, comprising:
   identifying a set of acoustic noise sources in a computer;
   receiving acoustic characteristics for each of the noise sources wherein the acoustic characteristics include characterization data that models acoustic noise produced by the respective noise source during operation;
   estimating acoustic noise for the computer by combining estimates for each of the noise sources obtained using the acoustic characteristics; and
   adjusting a setting of at least one component of the computer based on the estimated acoustic noise for the computer to manage acoustic noise produced by the computer.

21. The method of claim 20, wherein the operation of adjusting a setting of at least one component comprises reducing a thermal load of the computer.

22. The method of claim 21, wherein the operation of reducing a thermal load of the computer comprises adaptively throttling power used by the at least one component.

23. The method of claim 20, wherein the at least one component is one of the noise sources.

* * * * *